United States Patent [19]

Skutta et al.

[11] 4,201,960
[45] May 6, 1980

[54] METHOD FOR AUTOMATICALLY MATCHING A RADIO FREQUENCY TRANSMITTER TO AN ANTENNA

[75] Inventors: Frank R. Skutta; Lee D. Tice, both of Palantine, Ill.

[73] Assignee: Motorola, Inc., Schaumburg, Ill.

[21] Appl. No.: 909,155

[22] Filed: May 24, 1978

[51] Int. Cl.² .............................................. H03H 7/40
[52] U.S. Cl. .................................. 333/17 M; 455/123
[58] Field of Search .............. 333/17 M; 325/174, 177

[56] References Cited

U.S. PATENT DOCUMENTS

| 2,745,067 | 5/1956 | True et al. | 333/17 M |
| 3,509,500 | 4/1970 | McNair et al. | 333/17 M X |
| 3,794,941 | 2/1974 | Templin | 333/17 M |
| 3,995,237 | 11/1976 | Brunner | 333/17 M |
| 4,112,395 | 9/1978 | Seward | 333/17 M |

Primary Examiner—Paul L. Gensler
Attorney, Agent, or Firm—Sang Ki Lee; James W. Gillman

[57] ABSTRACT

A plurality of series inductors and shunt capacitors are provided between a radio transmitter and an antenna. The inductors and capacitors are arranged in binary increments and are inserted in, or withdrawn from the circuit via provided reed relays. A microprocessor activates the relays in one of several modes until the required degree of match is provided. The status of the relays is stored in provided memory such that upon tuning of the transmitter to the same channel a proper match condition can be established without resort to the matching program.

34 Claims, 5 Drawing Figures

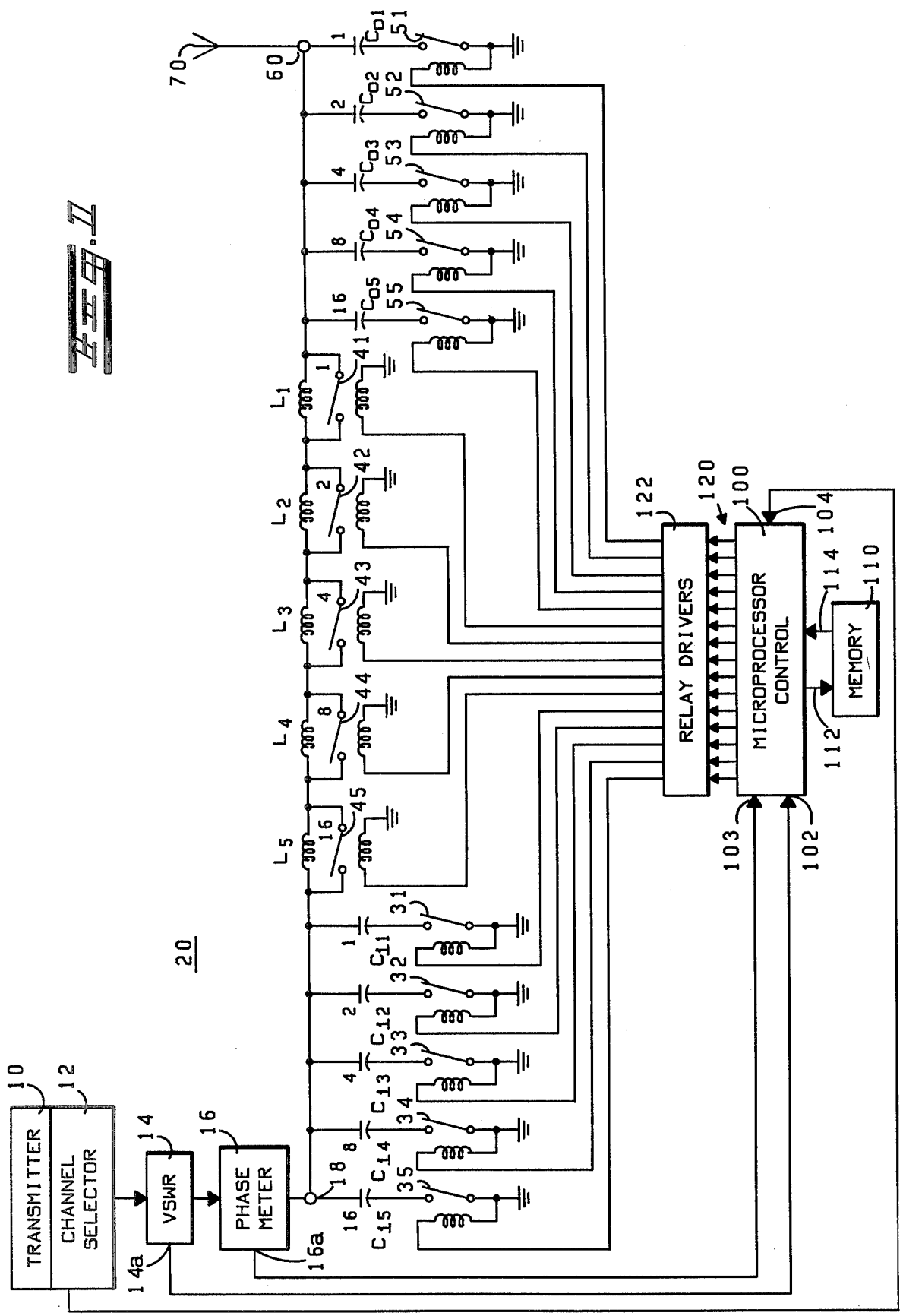

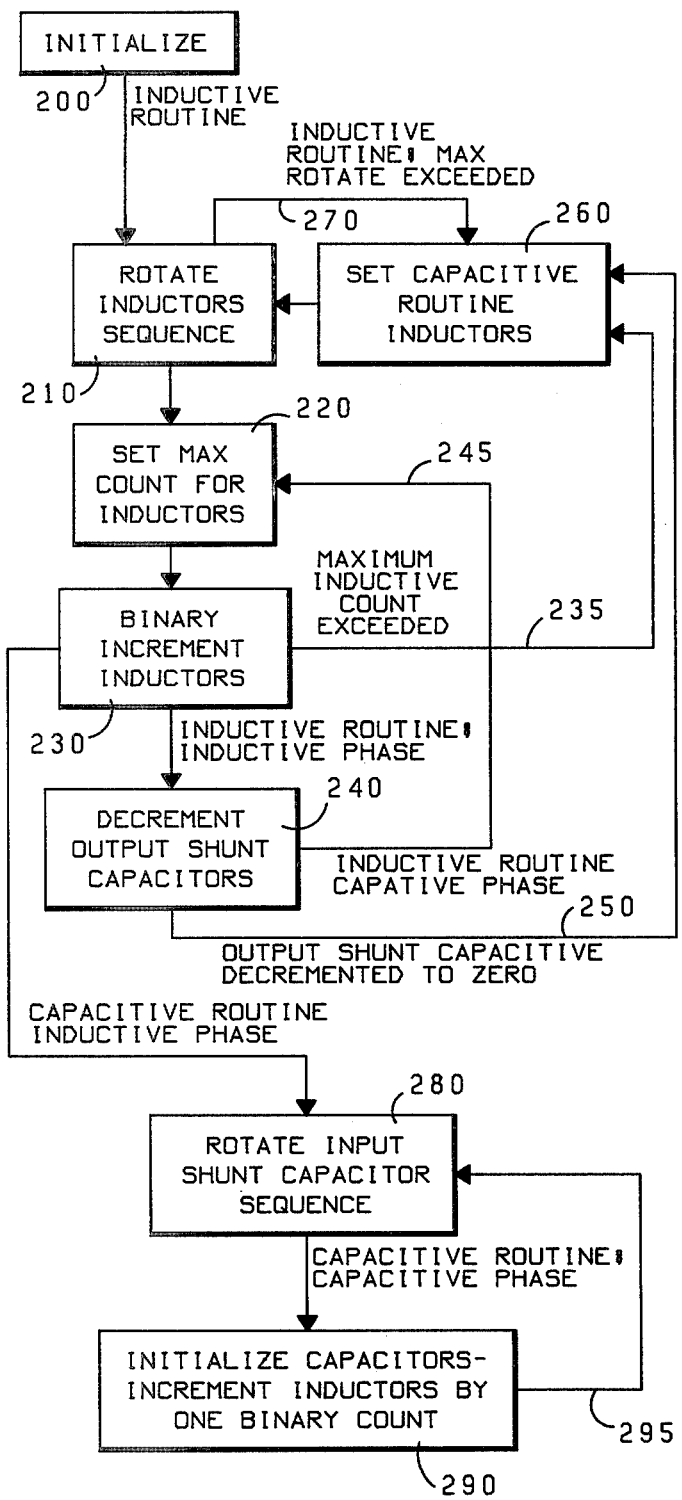
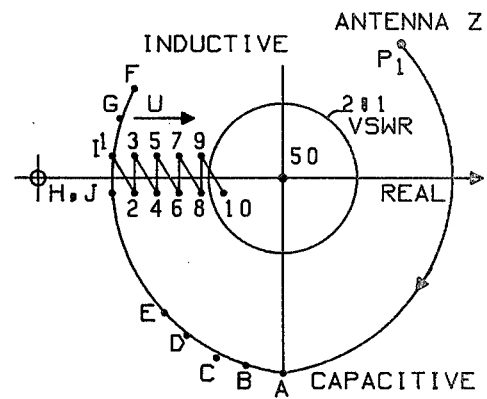
Fig. 3
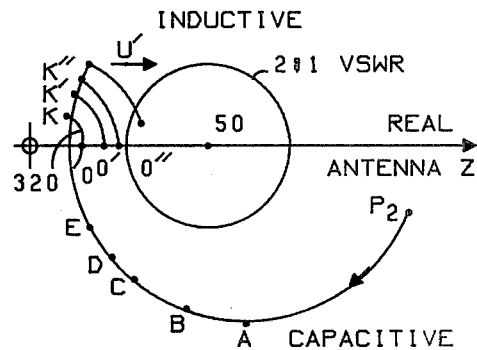
Fig. 4a
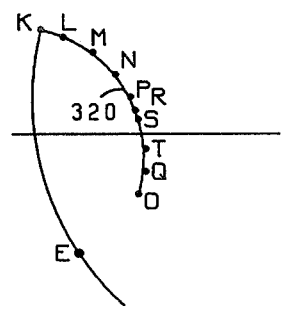
Fig. 4b
Fig. 2

METHOD FOR AUTOMATICALLY MATCHING A RADIO FREQUENCY TRANSMITTER TO AN ANTENNA

BACKGROUND OF THE INVENTION

The present invention pertains to the radio frequency art and, more particularly, to a method for matching the output of a radio transmitter to an antenna.

The prior art has developed numerous methods for the tuning of a radio frequency antenna to the output impedance of the transmitter, as this will assure maximum transmitted power. For fixed position, single frequency installations it is often possible to manually tune to the antenna only once without need for further concern. However, for applications wherein a transmitter is operable on any one of several channel frequencies and/or the antenna is subjected to varying conditions, such as in the case of marine applications, the maintenance of proper antenna tuning becomes very difficult.

One approach to a tunable antenna coupling circuit is given in U.S. Pat. No. 3,906,405, which issued Sept. 16, 1975 and is assigned to the same assignee as the instant application. In this approach, a series of inductors and capacitors are arranged between the transmitter and the antenna with relays operable to switch these components into or out of the circuit. The antenna is then manually tuned to the transmitter for each channel, with the optimum circuit configuration of the tuner being programmed via a diode matrix. Upon the transmitter being tuned to a given channel, the diodes activate the desired relays, thereby forming the proper matching circuit.

While the above described prior art circuit constituted a significant advance in the antenna tuning art, it suffers from numerous advantages. Firstly, that system requires a manual set up of the antenna. Also, it does not automatically account for changes in the impedance of the antenna as may be caused by, for example, by spraying salt water in marine installations.

Other attempts have been made to provide the semi-automatic tuning of an antenna. In one approach, manual tuning is accomplished to within a range, at which time a motor drives a variable capacitance to accomplish proper transmitter matching. Since the overall tuning range of this system is very small, the system provides limited utility.

SUMMARY OF THE INVENTION

It is an object of this invention, therefore, to provide an improved method for matching the impedance of a transmitter to an antenna, which method may be accomplished by fully automatic means.

It is a further object of the invention to provide the above described method which may be accomplished in economical manner and which requires short duration intervals for proper antenna matching.

Briefly, according to the invention, the method for matching the nominal real impedance of a transmitter to an antenna comprises the steps of providing an input terminal, adapted for connection to the transmitter, and an output terminal adapted for connection to the antenna. A variable series inductance is provided between the first and second terminals. A provided variable shunt capacitance is coupled to a predetermined one of the first and second terminals. In the tuning operation, the inductance and capacitance are predeterminedly varied in a first mode such that the impedance at the first terminal is substantially real having a value less than the nominal value. Then, the inductance and capacitance are varied in a second mode to increase the real part of the impedance at the first terminal until it is within a predetermined range from said nominal impedance, thereby establishing the impedance match.

BRIEF DESCRIPTION OF THE DRAWINGS

FIG. 1 is a schematic diagram illustrating the preferred embodiment of an antenna matching circuit which utilizes the inventive method;

FIG. 2 is a flow diagram illustrative of operation of the inventive method shown in the structure of FIG. 1;

FIG. 3 is a Smith chart representation of operation of the instant method for an inductive antenna;

FIG. 4a is a Smith chart representation of operation of the inventive method for a capacitive antenna; and FIG. 4b is an enlarged view of a section of the Smith chart shown in FIG. 4a.

DETAILED DESCRIPTION OF THE PREFERRED EMBODIMENT OF THE INVENTION

FIG. 1 illustrates the basic apparatus utilized to practice the method according to the invention. Here is shown a radio frequency transmitter 10. Transmitter 10 is of conventional design and, in this the preferred embodiment of the invention, has a nominal output impedance of 50 ohms. It should also be understood that a radio frequency receiver (not shown) may be associated with transmitter 10. In the conventional manner, the transmitter 10 may be tuned to any one of several channels by adjustment of an associated channel selector 12.

The output from transmitter 10 couples through a voltage standing wave ratio meter 14 and a phase meter 16 before being coupled to input terminal 18 of the antenna tuning elements, indicated generally at 20.

Voltage standing wave ratio (VSWR) meter 14 is of conventional design producing a signal at its output, 14a representative of the voltage standing wave ratio on the line. As is very well known in the radio frequency art, the standing wave ratio is an indicator of the relative match between sources or loads on opposite ends of the lines. Thus, for example, if the standing wave ratio is unity a perfect match exists.

Phase meter 16 is also of conventional design and compares current and voltage on the line, producing a signal at its output 16a indicative of the phase of the current/voltage relationship.

The inductor/capacitor bank 20 is comprised of five input shunt capacitors $C_{i1}$–$C_{i5}$. The input shunt capacitors $C_{i1}$–$C_{i5}$ are arranged in ascending binary incremented values such that, for example, is the relative capacitance of the first capacitor $C_{i1}$ is one, then that of the second capacitor $C_{i2}$ is two, that of the third $C_{i3}$ is four and so forth. Each input shunt capacitor $C_{i1}$–$C_{i5}$ is series coupled through relays 31–35 respectively, which relays, when activated, operate to connect the associated capacitor into the shunt circuit. Otherwise the input shunt capacitors are open circuited, and, thus, do not contribute to the antenna matching circuit.

Following the input shunt capacitors are a plurality of five series coupled inductors $L_1$–$L_5$. The series inductors $L_1$–$L_5$ have binary incremented values as with the input shunt capacitors. Thus the relative value of the first inductor $L_1$ is one, with inductors 2–5 having values two, four, eight and sixteen, respectively. A series of relays 41–45 are coupled in shunt across each of the inductors. Upon activation of an appropriate relay the corresponding inductance is shorted, thereby removing the inductance from the circuit. In the absence of activation of its relay, an inductor will be included within the antenna matching circuit.

Coupled to the output of the series inductors $L_1$–$L_5$ is a bank of five output shunt capacitors $C_{O1}$–$C_{O5}$. As with the input shunt capacitors, the output shunt capacitors are arranged in binary increasing values. Also, a series of relays 51–55 are series coupled to the output shunt capacitors $C_{O1}$–$C_{O5}$, respectively, whereby an output shunt capacitor is connect into the antenna matching circuit only upon activation of its relay.

A node at the output shunt capacitors defines the output terminal 60 of the antenna matching circuit and is adapted for conventional coupling to an antenna, such as antenna 70.

The basic control of the system is provided by a microprocessor 100. Microprocessor 100 has inputs 102, 103 for receiving the provided outputs from the voltage standing wave ratio meter 14 and phase meter 16, respectively. Also provided as to input to 104 to microprocessor 100 is the output from the channel selector switch 11. Thus, the channel to which the transmitter 10 is tuned is an input to the microprocessor 100.

Associated with microprocessor 100 is a random access memory 110. The microprocessor is capable of addressing and storing information in the memory 110 via an address bus 112 and can also retrieve stored memory on a retrieval bus 114.

The output from microprocessor 100 is a plurality of lines 120 which feed to a plurality of relay drivers 122. The relay drivers are provided with a plurality of 15 output lines, each of which couples to a predetermined one of the relays 31–35, 41–45 and 51–55 for controlling the status of the matching circuit.

Thus, in response to the channel selector 12, voltage standing wave ratio meter 14 and phase meter 16, the microprocessor provides suitable outputs on its output lines 120 causing the relay drivers 122 to activate those input shunt capacitors, series inductors and output shunt capacitors suitable for matching the transmitter 10 to the antenna 70. Once the microprocessor control 100 has determined that a particular circuit configuration is optimum for matching on a given channel, this information is loaded into memory 110 via address bus 112. Upon subsequent selection of that channel via channel selector 12, the information is retrieved from memory via retrieval bus 114 and the shunt capacitors and inductors are programmed accordingly.

It should be noted that the microprocessor 100 may be comprised of any of numerous commercially available microprocessor units. Any one of ordinary skill in this art could, having been given the following description of operation of the microprocessor 100, easily construct an operable embodiment of the invention.

FIG. 2 is a flow diagram illustrating the manner in which, according to the preferred embodiment of the invention, the microprocessor 100 is programmed.

Firstly, according to block 200, the system is initialized. In the initialized condition, it is assumed that the antenna is inductive and, thus, the microprocessor runs through the inductive routine. Table I details an example of the inductive routine and reference should be made to the Smith chart of FIG. 3 which illustrates the physical effects of this routine.

TABLE I

| Chart | $C_{O5}$ | $C_{O4}$ | $C_{O3}$ | $C_{O2}$ | $C_{O1}$ | $L_5$ | $L_4$ | $L_3$ | $L_2$ | $L_1$ | θ |
|---|---|---|---|---|---|---|---|---|---|---|---|
| A | 1 | 1 | 1 | 1 | 1 | 0 | 0 | 0 | 0 | 0 | C |
| B | 1 | 1 | 1 | 1 | 1 | 0 | 0 | 0 | 0 | 1 | C |
| C | 1 | 1 | 1 | 1 | 1 | 0 | 0 | 0 | 1 | 0 | C |
| D | 1 | 1 | 1 | 1 | 1 | 0 | 0 | 0 | 1 | 1 | C |
| E | 1 | 1 | 1 | 1 | 1 | 0 | 0 | 1 | 0 | 0 | C |
|   | 1 | 1 | 1 | 1 | 1 | 0 | 0 | 1 | 1 | 0 | C |
|   | 1 | 1 | 1 | 1 | 1 | 0 | 0 | 1 | 1 | 1 | C |
|   | 1 | 1 | 1 | 1 | 1 | 0 | 1 | 0 | 0 | 0 | C |
|   | 1 | 1 | 1 | 1 | 1 | 0 | 1 | 1 | 0 | 0 | C |
|   | 1 | 1 | 1 | 1 | 1 | 0 | 1 | 1 | 1 | 0 | C |
|   | 1 | 1 | 1 | 1 | 1 | 0 | 1 | 1 | 1 | 1 | C |
|   | 1 | 1 | 1 | 1 | 1 | 1 | 0 | 0 | 0 | 0 | C |
| F | 1 | 1 | 1 | 1 | 1 | 1 | 1 | 0 | 0 | 0 | I |
| G | 1 | 1 | 1 | 1 | 1 | 1 | 0 | 1 | 0 | 0 | I |
| H | 1 | 1 | 1 | 1 | 1 | 1 | 0 | 0 | 1 | 0 | C |
| I | 1 | 1 | 1 | 1 | 1 | 1 | 0 | 0 | 1 | 1 | I |
| J | 1 | 1 | 1 | 1 | 1 | 1 | 0 | 0 | 1 | 0 | C |

Thus, at initialize block 200 all of the relays 51–55 are activated, coupling the output shunt capacitors $C_{O1}$–$C_{O5}$ into the circuit, and all of the relays 41–45 of the series inductors $L_1$–$L_5$ are activated thereby replacing them with a shunt circuit. In the inductive routine the input shunt capacitors $C_{i1}$–$C_{i5}$ are not utilized, therefore their relays 31–35 remain inactive. In Table I, a "1" indicates that a component is in the circuit whereas a "0" indicates that it is not. A "C" indicates capacitive phase and an "I" indicates an inductive phase angle.

Thus, initially all output shunt capacitors are in the circuit and all series inductors are shunted (electrically disabled) from the circuit. Thus, referring to FIG. 3, the impedance of the antenna, which initially is at point $P_1$ on the Smith chart is rotated clockwise to point A by the addition of the output shunt capacitors.

Following the initialize block 200 the rotate inductor sequence 210 is initiated. Here, the series inductance is increased by incrementing the series inductors $L_1$–$L_5$ according to the truth table shown in Table I. Thus, this sequence begins: $L_1$, $L_2$, $L_1+L_2$, $L_3$, $L_3+L_2$, $L_3+L_2+L_1$, $L_4$ and so forth. Referring to FIG. 3, the effect of increasing the series inductance is to rotate the impedance seen at the input terminal 18 in a clockwise manner. This rotate up sequence continues until the phase at the first terminal 18 of the antenna tuner is inductive, as is indicated by phase meter 16 to the microprocessor 100. This is illustrated as point F on FIG. 3. Once the phase is sensed as having gone inductive, the microprocessor removes the elemental value which resulted in the phase going inductive and inserts the next lower inductor. If this next lower element causes the phase to still be inductive point G, then it, also, is removed and the previous procedure repeats. If this next lower element results in the phase being capacitive Point H, then it is left in the circuit. If it is not, then the next lower value is added to the circuit and is subjected to the same decision process as above. This routine continues until no more lower element values remain. This is illustrated in a sample tuning sequence in Table I with reference to FIG. 3 chart references F, G, H, I and J. The phase would be slightly capacitive at this point in the tuning algorithm. At block 220, the microprocessor stores in memory that count for the largest inductor used during the rotate up sequence. For the example of Table I, the highest inductor used was inductor $L_5$.

At block 230 the series inductance is increased by binary incrementing the series inductors $L_1$–$L_5$ from their values at the conclusion of the rotate inductor sequence 210 until the phase is detected as going just inductive, point 1. Following this, in block 240, the output shunt capacitors are decremented, also in a binary sequence, until the phase returns going just capacitive, point 2. The process of binary increasing the inductance and decreasing the capacitance is continued via a feedback loop 245. In this manner, the impedance seen at the antenna matching network first terminal 18 sequentially increases in real value, as is indicated by arrow V in FIG. 3 and is indicated by reference numerals 1-10. If, during this sequence, the voltage standing wave ratio, as sensed by microprocessor 100 at its input 102, reaches 4:1, the series inductance and output shunt capacitance values are stored in memory and the procedure is allowed to continue. If, on continuing in the inductive mode, a voltage standing wave ratio of 2:1 is reached, this is stored in memory, erasing the 4:1 stored settings. Finally, if a VSWR of 1.2:1 is reached, these values are stored in memory replacing those for 2:1 and the system stops since a match, within a suitable range, has been obtained. These values are then stored in memory to be used upon the transmitter being returned to the same channel.

If the system is incremented through all of the inductors, as illustrated by an output line 235, or if it is decremented to zero all of the outputs shunt capacitors, indicated by an output line to 250, the system is activated to the capacitive routine, as indicated by block 260. The capacitive routine 260 can also be activated if in the rotate inductor sequence 210 the system rotates through all of the inductors without detecting a phase change from capacitive to inductive, indicated via line 270.

Table II, and corresponding FIGS. 4a and 4b illustrate an example of operation in the capacitive mode.

Here, the antenna initially begins with a capacitive value $P_2$, as shown on FIG. 4a. As before, the first step comprises rotating the inductors, as shown by block 210. In this mode all input shunt capacitors and output shunt capacitors have been removed from the circuit by 260 in response to outputs and 250 or 270. As before, the inductors are rotated until the impedance, as sensed by the phase meter 16, at the first terminal 18 goes inductive. As before, the system increments the series inductance until the rotate sequence stops with the impedance at the first terminal 18 being slightly capacitive.

The maximum count for the inductors is stored, as indicated by block 220 and, as before in block 230, the series inductance is increased by binary increments until the impedance at the first terminal 18 goes slightly inductive, as is illustrated by point K on FIGS. 4a and 4b. FIG. 4b is an enlarged section of arc 320 shown in FIG. 4a. Following this condition, in the capacitive routine, the input shunt capacitors are rotated up, as indicated by block 280. As shown in Table II, the rotation of the input shunt capacitors is accomplished by sequentially activating increasing value shunt capacitors until the phase as sensed at the first terminal 18 goes capacitive (point O in FIG. 4b).

TABLE II

| CHART | $C_{i5}$ | $C_{i4}$ | $C_{i3}$ | $C_{i2}$ | $C_{i1}$ | $L_5$ | $L_4$ | $L_3$ | $L_2$ | $L_1$ | 0 |
|---|---|---|---|---|---|---|---|---|---|---|---|
| A | 0 | 0 | 0 | 0 | 0 | 0 | 0 | 0 | 0 | 0 | C |
| B | 0 | 0 | 0 | 0 | 0 | 0 | 0 | 0 | 0 | 1 | C |
| C | 0 | 0 | 0 | 0 | 0 | 0 | 0 | 0 | 1 | 0 | C |
| D | 0 | 0 | 0 | 0 | 0 | 0 | 0 | 0 | 1 | 1 | C |
| E | 0 | 0 | 0 | 0 | 0 | 0 | 0 | 1 | 0 | 0 | C |
|   | 0 | 0 | 0 | 0 | 0 | 0 | 0 | 1 | 1 | 0 | C |
|   | 0 | 0 | 0 | 0 | 0 | 0 | 0 | 1 | 1 | 1 | C |
|   | 0 | 0 | 0 | 0 | 0 | 0 | 1 | 0 | 0 | 0 | C |
|   | 0 | 0 | 0 | 0 | 0 | 0 | 1 | 1 | 0 | 0 | C |
|   | 0 | 0 | 0 | 0 | 0 | 0 | 1 | 1 | 1 | 0 | C |
|   | 0 | 0 | 0 | 0 | 0 | 0 | 1 | 1 | 1 | 1 | C |
|   | 0 | 0 | 0 | 0 | 0 | 1 | 0 | 0 | 0 | 0 | C |
|   | 0 | 0 | 0 | 0 | 0 | 1 | 1 | 0 | 0 | 0 | I |
|   | 0 | 0 | 0 | 0 | 0 | 1 | 0 | 1 | 0 | 0 | I |
|   | 0 | 0 | 0 | 0 | 0 | 1 | 0 | 0 | 1 | 0 | C |
|   | 0 | 0 | 0 | 0 | 0 | 1 | 0 | 0 | 1 | 1 | I |
|   | 0 | 0 | 0 | 0 | 0 | 1 | 0 | 0 | 1 | 0 | C |
| K | 0 | 0 | 0 | 0 | 0 | 1 | 0 | 0 | 1 | 1 | I |
| L | 0 | 0 | 0 | 0 | 1 | 1 | 0 | 0 | 1 | 1 | I |
| M | 0 | 0 | 0 | 1 | 0 | 1 | 0 | 0 | 1 | 1 | I |
|   | 0 | 0 | 1 | 0 | 0 | 1 | 0 | 0 | 1 | 1 | I |
| N | 0 | 1 | 0 | 0 | 0 | 1 | 0 | 0 | 1 | 1 | I |
| O | 1 | 0 | 0 | 0 | 0 | 1 | 0 | 0 | 1 | 1 | C |
| P | 0 | 1 | 0 | 0 | 0 | 1 | 0 | 0 | 1 | 1 | I |
| Q | 0 | 1 | 1 | 0 | 0 | 1 | 0 | 0 | 1 | 1 | C |
| R | 0 | 1 | 0 | 1 | 0 | 1 | 0 | 0 | 1 | 1 | I |
| S | 0 | 1 | 0 | 1 | 1 | 1 | 0 | 0 | 1 | 1 | I |
| T | 0 | 1 | 1 | 0 | 0 | 1 | 0 | 0 | 1 | 1 | C |

Following this, the elemental shunt capacitor value that caused the phase to go capacitive is removed, and the next smaller valued capacitor is activated, causing the phase sense to be inductive once again, point P. The next sequential lower value of shunt capacitance is activated and the phase sense is monitored to detect if this elemental value caused the phase to become capacitive. If it does point Q, then it is removed and the next lower sequential value is activated point R, repeating the above process. If it does not cause the phase to become capacitive, then it is left in the circuit and the next lower sequential value is activated and subjected to the above process to determine if it should be left in or removed from the circuit depending on it's effect upon the phase. The result of this procedure by sequentially incrementing lower shunt capacitors, at the input terminal 18, is to approximate the zero phase point, slightly on the inductive side. At this point, the input shunt capacitors are binarily incremented to the capacitive phase to insure that the zero phase detect was indeed crossed. In the example in Table II, point T is where the sequence ends with the impedance at the first terminal 18 being slightly capacitive.

Following the rotate shunt capacitance sequence, all input shunt capacitors are initialized to zero and the inductance is incremented by one binary count, as indicated by block 290. A feedback loop 295 returns to the capacitor rotate sequence 280 thus continuing the cycle point K'. By repetitions through this loop K" etc.), the real part of the impedance at the first terminal 18 increases, indicated by the arrow U' of FIG. 4a. As in the inductive mode, if voltage standing wave ratios of 4:1, 2:1 and/or 1.2:1 are achieved throughout the capacitive mode sequence, the values of inductors and capacitors are stored in memory to be subsequently recalled upon retuning to the same channel.

It should be noted that, whether operating in the capacitive or the inductive mode, the values of the shunt capacitors and the series inductors must be suitably selected such that the impedance seen at the first terminal 18 can be located on the real axis of the Smith chart at a value less than the nominal impedance of the transmitter, here, less than 50 ohms.

By using the algorithms given hereinabove, the microprocessor controlled automatic antenna matching system can achieve proper impedance matching within a very short time interval. Also, the instant algorithms given provide a practical means for incrementing and decrementing component values which takes into account parasitic effects such as the stray capacitance associated with the relays used to activate the components.

In summary, a fully automatic method for matching an antenna to a radio frequency transmitter has been described. The system not only achieves the desired antenna matching within a very short time, but it also requires the use of inexpensive, standard sensing devices, such as a phase meter and a voltage standing wave ratio meter.

While a preferred embodiment of the invention has been described in detail, it should be apparent that many modifications and variations thereto are possible, all of which fall within the true spirit and scope of the invention.

For example, whereas in the instant preferred embodiment of the invention five input shunt capacitors, five series inductors, and five output shunt capacitors are shown, it should be understood that in a given system configuration any number of circuit components may be employed, such as, in general, a number of N inductors and M capacitors, with N and M being selected in accordance with the system constraints.

We claim:

1. A method for matching the nominal real impedance of a transmitter to an antenna comprising the steps of:
   (a) providing a first terminal adapted for connection to said transmitter;
   (b) providing a second terminal adapted for connection to said antenna;
   (c) providing a variable series inductance coupled between said first and second terminals;
   (d) providing a variable shunt capacitance coupled to a predetermined one of said first and second terminals;
   (e) predeterminedly controlling said inductance and capacitance in a first mode such that the impedance at said first terminal is substantially real having a value less than said nominal real impedance; and
   (f) predeterminedly varying said inductance and capacitance in a second mode to increase the real part of the impedance at said first terminal until it is within a predetermined range from said nominal impedance.

2. The method of claim 1 wherein step (c) further comprises the steps of:
   (i) providing a plurality of predetermined value, series coupled inductors coupled between said first and second terminals; and
   (ii) providing a means to selectively shunt said inductors.

3. The method of claim 1 wherein step (d) further comprises the steps of:
   (i) providing a plurality of predetermined value capacitors;
   (ii) providing a means to selectively couple said capacitors between a predetermined one of said first and second terminals and a reference potential.

4. The method of claim 1 wherein step (e) further comprises the steps of:
   (i) providing a phase meter means;
   (ii) coupling said phase meter means to said first terminal; and
   (iii) utilizing said phase meter to determine that inductance/capacitance condition at which the impedance at said first terminal is substantially real.

5. The method of claim 1 wherein step (f) further comprises the steps of:
   (i) providing a standing wave ratio meter means;
   (ii) coupling said standing wave ratio meter to said first terminal; and
   (iii) utilizing said standing wave ratio meter to determine that inductance/capacitance condition at which the impedance at said first terminal is within a predetermined range from said nominal impedance.

6. The method of claim 4 wherein step (f) further comprises the steps of:
   (i) providing a standing wave ratio meter means;
   (ii) coupling said standing wave ratio meter to said first terminal; and
   (iii) utilizing said standing wave ratio meter to determine that inductance/capacitance condition at which the real part of the impedance at said first terminal is within a predetermined range from said nominal impedance.

7. The method of claim 1 wherein the antenna is inductive and wherein step (e) further comprises the steps of:
   (i) coupling sufficient shunt capacitance to said second terminal such that the impedance at the first terminal has a real part less than said nominal impedance and a capacitive reactance;
   (ii) predeterminedly increasing said series inductance until the impedance at the first terminal becomes inductive with a real part being less than the real part of said nominal impedance.

8. The method of claim 7 wherein step (e) further comprises the step of:
   (iii) predeterminedly decreasing said series inductance by relatively small amounts until the impedance at said first terminal is capacitive.

9. The method of claim 7 wherein step (e) further comprising the steps of:
   (iii) predeterminedly decreasing said series inductance by relatively small amounts until the impedance at said first terminal is capacitive; and
   (iv) predeterminedly increasing said series inductance by smaller yet amounts until the impedance at said first terminal is inductive.

10. The method of claim 8 wherein step (f) further comprises the steps of:
    (i) predeterminedly increasing the series inductance until the impedance at the first terminal is inductive;
    (ii) predeterminedly decreasing the shunt capacitance at said second terminal until the impedance at the first terminal is capacitive; and
    (iii) repeating steps (i) and (ii) above until the impedance at the first terminal is within said predetermined range.

11. The method of claim 9 wherein step (f) further comprises the steps of:
    (i) predeterminedly increasing the series inductance until the impedance at the first terminal is inductive;
    (ii) predeterminedly decreasing the shunt capacitance at said second terminal until the impedance at the first terminal is capacitive; and (iii) repeating steps (i) and (ii) above until the impedance at the first terminal is within said predetermined range.

12. The method of claim 7 wherein step (c) further comprises the steps of:
(i) providing a plurality of N predetermined value, series coupled inductors coupled between said first and second terminals, said N inductors having values increasing in binary increments, $L_1$ to $L_N$; and
(ii) providing a means to selectively shunt said inductors.

13. The method of claim 12 wherein step (e) part (ii) further comprises the step of:
increasing said series inductance according to the following sequence:
$L_1, L_2, L_1+L_2, L_3, L_3+L_2, L_3+L_2+L_1, L_4, \ldots$
until the impedance at the first terminal becomes inductive with a real part being less than the real part of said nominal impedance.

14. The method of claim 8 wherein step (e) part (ii) further comprises the step of:
increasing said series inductance according to the following sequence:
$L_1, L_2, L_1+L_2, L_3, L_3+L_2, L_3+L_2+L_1, L_4, \ldots$
until the impedance at the first real part being less than the real part of said nominal impedance.

15. The method of claim 14 wherein step (e) part (iii) further comprises the step of:
decreasing said series inductance from its value established in step (e), part (ii) by shunting out that inductor $L_k$ whose value made the impedance at the first terminal inductive and successively activating those inductors of decreasing incremental binary value, $L_{k-1}, L_{k-2} \ldots$, until the impedance at said first terminal is capacitive.

16. The method of claim 10 wherein step (c) further comprises the step of:
(i) providing a plurality of N predetermined value, series coupled inductors coupled between said first and second terminals, said N inductors having values increasing in binary increments, $L_1$ to $L_N$;
(ii) providing a means to selectively shunt said inductors.

17. The method of claim 16 wherein step (d) further comprises the steps of:
(i) providing a plurality of M predetermined value capacitors, said capacitors having increasing values $C_1$ to $C_M$, in binary increments;
(ii) providing a means to selectively couple said capacitors between said output terminal and a reference potential.

18. The method of claim 17 wherein step (f) part (i) comprises incrementing said inductors according to a binary sequence and wherein step f part (ii) comprises decrementing the shunt capacitor according to a binary sequence.

19. The method of claim 18 wherein step (e) further comprises the steps of:
(iv) providing a phase meter means;
(v) coupling said phase meter means to said first terminal; and
(vi) utilizing said phase meter to determine that inductance/capacitance condition at which the impedance at said first terminal is substantially real.

20. The method of claim 18 wherein step (f) further comprises the steps of:
(iv) providing a standing wave ratio meter means;
(v) coupling said standing wave ratio meter to said first terminal; and
(vi) utilizing said standing wave ratio meter to determine that inductance/capacitance condition at which the real part of the impedance at said first terminal is within a predetermined range from said nominal impedance.

21. The method of claim 19 wherein step (f) further comprises the steps of:
(iv) providing a standing wave ratio meter means;
(v) coupling said standing wave ratio meter to said first terminal; and
(vi) utilizing said standing wave ratio meter to determine that inductance/capacitance condition at which the real part of the impedance at said first terminal is within a predetermined range from said nominal impedance.

22. The method of claim 1 wherein the antenna is capacitive and wherein step (e) comprises the steps of:
(i) predeterminedly increasing the series inductance until the impedance at the first terminal is inductive having a real part less than said nominal impedance;
(ii) predeterminedly increasing the shunt capacitance coupled to said first terminal until the impedance thereat is slightly capacitive.

23. The method of claim 22 wherein step (f) further comprises the steps of:
(i) providing a plurality of capacitors of predetermined values for forming said variable shunt capacitance;
(ii) decoupling all shunt capacitors from said first terminal;
(iii) predeterminedly incrementing the series inductance;
(iv) predeterminedly increasing the shunt capacitance coupled to said first terminal until the impedance thereat is slightly capacitive;
(v) repeating steps (i), (ii) and (iii) until the real part of the impedance at said first terminal is within said predetermined range from said nominal impedance.

24. The method of claim 22 wherein step (c) further comprises the steps of:
(i) providing a plurality of N predetermined value, series coupled inductors coupled between said first and second terminals, said inductors having increasing values, $L_1$ to $L_N$, in binary increments; and
(ii) providing a means to selectively shunt said inductors.

25. The method of claim 24 wherein step (e) part (i) further comprises the step of:
increasing said series inductance according to the following sequence:
$L_1, L_2, L_1+L_2, L_3, L_3+L_2, L_3+L_2+L_1, L_4 \ldots$ until the impedance at the first terminal becomes inductive.

26. The method of claim 25 wherein step (e) part (i) further comprises the step of:
decreasing said series inductance from the value established in step (e) part (i) by shunting out that inductor $L_k$ whose value made the impedance at the first terminal inductive and successively activating those inductors of decreasing incremental binary value, $L_{k-1}, L_{k-2}, \ldots$, until the impedance at said first terminal is capacitive.

27. The method of claim 25 wherein step (d) further comprises the steps of:

(i) providing a plurality of M predetermined value capacitors, said capacitors having increasing values, $C_1$ to $C_M$, in binary increments; and (ii) providing a means to selectively couple said capacitors between said input terminal and a reference potential.

28. The method of claim 27 wherein step (e) part (ii) further comprises the step of:

sequentially activating increasing value shunt capacitors until the impedance at said first terminal is capacitive and then alternately decreasing and increasing said shunt capacitance by incrementally smaller amounts until the impedance at said first terminal has a relatively small capacitive reactance.

29. The method of claim 28 wherein step (f) further comprises the steps of:

(i) decoupling all shunt capacitors from said first terminal;

(ii) predeterminedly incrementing the series inductance by one binary count;

(iii) predeterminedly incrementing the shunt capacitance coupled to the first terminal in accordance with step (e) part (ii);

(iv) repeating steps (i), (ii) and (iii) until the real part of the impedance at said first terminal is within a predetermined range from said nominal value.

30. The method of claim 29 wherein step (e) further comprises the steps of:

(i) providing a phase meter means;

(ii) coupling said phase meter means to said first terminal; and (iii) utilizng said phase meter to determine that inductance/capacitance condition at which the impedance at said first terminal is substantially real.

31. The method of claim 29 wherein step (f) further comprises the steps of:

(iv) providing a standing wave ratio meter means;

(v) coupling said standing wave ratio meter to said first terminal; and (vi) utilizing said standing wave ratio meter to determine that inductance/capacitance condition at which the real part of the impedance at said first terminal is within a predetermined range from said nominal impedance.

32. The method of claim 29 wherein step (f) further comprises the steps of:

(iv) providing a standing wave ratio meter means;

(v) coupling said standing wave ratio meter to said first terminal; and (vi) utilizing said standing wave ratio meter to determine that inductance/capacitance condition at which the real part of the impedance at said first terminal is within a predetermined range from said nominal impedance.

33. The method of claim 18 wherein said transmitter is operable on a plurality of channels with at least two channels requiring different matching characteristics comprising the further steps of:

(i) storing in memory the series inductance/shunt capacitance settings which optimize antenna matching for a given channel; and (ii) recalling from memory those stored settings and re-establishing said optimized antenna matching corresponding to the transmitter being operated on said channel.

34. The method of claim 29 wherein said transmitter is operable on a plurality of channels with at least two channels requiring different matching characteristics comprising the further steps of:

(i) storing in memory the series inductance/shunt capacitance settings which optimize antenna matching for a given channel; and (ii) recalling from memory those stored settings and re-establishing said optimized antenna matching corresponding to the transmitter being operated on said channel.

* * * * *

UNITED STATES PATENT AND TRADEMARK OFFICE
CERTIFICATE OF CORRECTION

PATENT NO. : 4,201,960
DATED : May 6, 1980
INVENTOR(S) : FRANK R. SKUTTA and LEE DON TICE It is certified that error appears in the above-identified patent and that said Letters Patent are hereby corrected as shown below:

Col. 1, line 36, "advantages" should be --disadvantages--.

Col. 2, line 45, after "unity" insert --then--.

Col. 3, line 13, "connect" should be --connected--.

Col. 3, line 23, delete "to" (first and second occurrences).

Col. 5, line 10, "V" should --U-- and "is" should be --as--.

Col. 5, line 40, after "outputs" insert --235--.

Col. 6, line 35, "it's" should be --its--.

Col. 6, line 50, delete "(".

Col. 11, line 34, "utilizng" should be --utilizing--.

Signed and Sealed this

Thirtieth Day of September

[SEAL]

Attest:

SIDNEY A. DIAMOND

Attesting Officer

Commissioner of Patents and Trader